United States Patent

Blaser et al.

[11] Patent Number: 6,163,710
[45] Date of Patent: Dec. 19, 2000

[54] METHOD AND APPARATUS FOR COMPLIANCE TO MULTIPLE FREQUENCY PLANS

[75] Inventors: Robert J. Blaser, Evington; Thomas A. Przelomiec, Lynchburg, both of Va.

[73] Assignee: Ericsson, Inc., Research Triangle Park, N.C.

[21] Appl. No.: 08/954,163

[22] Filed: Oct. 20, 1997

[51] Int. Cl.[7] .............. H04B 1/38; H04B 1/40; H04B 1/18
[52] U.S. Cl. .......... 455/552; 455/77; 455/180.3; 455/192.1; 455/259
[58] Field of Search ................... 455/447, 450, 455/452, 463, 75, 76, 77, 260, 264, 255, 256, 257, 258, 259, 426, 552, 553, 180.1, 180.2, 180.3, 182.2, 188.1, 192.1, 192.2; 329/307, 308, 309, 103; 331/18; 375/216, 219, 340, 344, 324–327, 373–376, 371

[56] References Cited

U.S. PATENT DOCUMENTS

| | | | |
|---|---|---|---|
| 4,189,689 | 2/1980 | Triplett | 332/124 |
| 4,355,404 | 10/1982 | Uzunoglu | 375/332 |
| 4,713,631 | 12/1987 | Endeby et al. | 331/36 C |
| 5,111,162 | 5/1992 | Hietala et al. | 332/127 |
| 5,124,671 | 6/1992 | Srivastava | 331/10 |
| 5,184,091 | 2/1993 | Srivastava | 331/10 |
| 5,280,644 | 1/1994 | Vannatta et al. | 455/265 |
| 5,289,506 | 2/1994 | Kitayama et al. | 375/344 |
| 5,335,354 | 8/1994 | Koike | 455/192.2 |
| 5,388,125 | 2/1995 | Toda et al. | 375/332 |
| 5,493,700 | 2/1996 | Hietala et al. | 455/75 |
| 5,499,393 | 3/1996 | Fukui | 455/264 |
| 5,508,659 | 4/1996 | Brunet et al. | 331/16 |
| 5,535,432 | 7/1996 | Dent | 455/77 |
| 5,548,811 | 8/1996 | Kumagai et al. | 455/192.2 |
| 5,552,749 | 9/1996 | Nowatski et al. | 331/14 |
| 5,694,414 | 12/1997 | Smith et al. | 375/200 |
| 5,740,525 | 4/1998 | Spears | 455/259 |
| 5,796,772 | 8/1998 | Smith et al. | 375/200 |
| 5,896,562 | 4/1999 | Heinonen | 455/76 |
| 5,933,059 | 8/1999 | Asokan | 331/18 |
| 5,937,335 | 8/1999 | Park et al. | 455/86 |
| 5,974,302 | 10/1999 | Adamiecki et al. | 455/84 |
| 5,983,081 | 11/1999 | Lehtinen | 455/76 |

FOREIGN PATENT DOCUMENTS

| | | |
|---|---|---|
| 527481 | 2/1993 | European Pat. Off. . |
| 779710 | 6/1997 | European Pat. Off. . |
| WO 95 12253 | 5/1995 | WIPO . |
| WO 96 38992 | 12/1996 | WIPO . |

*Primary Examiner*—Reinhard J. Eisenzopf
*Assistant Examiner*—Charles N. Appiah
*Attorney, Agent, or Firm*—Nixon & Vanderhye P.C.

[57] ABSTRACT

A mobile radio for use in multiple different frequency plans is disclosed. The multiple different frequency plans, such as land-based plans (cellular, land mobile radio, etc.) and satellite-based plans may employ different frequency bands and, within those different bands, different frequency channel step sizes. The mobile radio employs only a single loop synthesizer to accommodate all of the different plans, including all of the different channel step sizes. It does so by employing a dynamically programmable divider circuit within the single loop synthesizer for macro-adjustment of the local oscillator frequency and a dynamically adjustable reference oscillator within the single loop synthesizer for micro-adjustment of the local oscillator frequency depending upon a recovered carrier signal.

17 Claims, 3 Drawing Sheets

METHOD AND APPARATUS FOR COMPLIANCE TO MULTIPLE FREQUENCY PLANS

FIELD OF THE INVENTION

The present invention relates to telecommunications. More particularly, the present invention relates to mobile radios for use in multiple frequency plans.

BACKGROUND OF THE INVENTION

Mobile radios traditionally operate within a defined frequency band and within certain predefined channels in the frequency band given by the particular applications of the radios. For example, a mobile radio used in a cellular radio system will be connected to other mobile radios in the cellular radio system at an assigned channel of, for example (in North America), a 30 KHz band between 824 MHz and 849 MHz for transmit frequencies (or 869 MHz to 894 MHz) for receive frequencies. This results in 832 possible channels within the assigned frequency bands.

As is well known, geographical areas for cellular radio communications are divided into cells. Common practice is to assign a certain number of the 832 possible channels (less any control channels) to each cell, for example 10–50 per cell. The number of channels used per cell depends, of course, on the traffic loads, etc. As mobile radios move from cell to cell, they are considered to be "roaming" and may change channels as they do so.

Other mobile radio applications will use different channel bands at different frequencies. Land mobile radio bands, for example, currently broadcast on channels that are 25 KHz wide. GSM (Ground System Mobile-European Cellular System) and PCS (Personal Communication System) can operate at still different channel frequency bands over different total system bandwidthes. An example of a mobile radio roaming through various different types of mobile radio frequencies plans is shown in FIG. 1. There, the mobile radio is shown as potentially existing in Land Mobile Radio (LMR), Cellular, Ground System Mobile (GSM), and Personal Communication System (PCS) networks.

The different channel frequency bands and the different system bandwidths that characterize different mobile radio systems are referred to as frequency plans. The different frequency plans that exist for different mobile radio systems cause common mobile radios to be practically un-usable across the multiple plans. Thus, traditionally, radios are operational within a fixed and unique frequency plan, such as North American Cellular or Land Mobile, but not both. Since the different frequency plans are separated by constant, fixed-size channel frequency steps of different length, the radios were designed to accommodate one such step length, but not the other (without expensive, impractical modifications).

Thus, for example, the North American Cellular system using 30 KHz steps will employ channels having frequencies of n·30 KHz, where n is an integer. On the other hand, the Land Mobile Radio bands, employ channels having frequencies of n·25 KHz, where n is an integer. Radios include circuitry that allow them to step through the total frequency band in the integer increments of the channel widths (i.e. integer multiples of 30 KHz) of the frequency plan in which they are intended to operate.

A radio would increase its flexibility and therefore its marketability if it could comply with non-integer (n<1) frequency steps and thus operate within multiple frequency plans. The two traditional solutions to this problem have proven to be impractical. The first solution was to employ a multiple loop synthesizer architecture within the mobile radio. In these radios, one synthesizer was employed per frequency plan thus increasing expense and complexity even though the multiple synthesizer shared a common reference oscillator. The other solution employed dividing the reference frequency into high common-denominators for the step sizes desired. But, this approach resulted in performance degradation due to the introduction of large spurious signals.

SUMMARY OF AN EXAMPLE EMBODIMENT OF THE INVENTION

The present invention solves many of the problems associated with previous multiple frequency plan radios. In accordance with one example embodiment of the invention, a radio operates within multiple frequency plans without adding circuit complexity or cost to present day radio designs. It does this using dynamic reprogramming of the local oscillator of the radio. Prior radio designs employed a local oscillator because of its optimum balance in constant frequency step size systems between local oscillator spurious signal creation versus frequency settling time. This worked well in a constant frequency step size system (where n is an integer), but did not work well when the radio was to be employed in different frequency step size environments. The present invention envisions using the automatic frequency control of the master reference oscillator of the radio together with dynamic reprogramming of the local oscillator of the radio to realize non-constant frequency step sizes while preserving a proper balance between spurious signal creation and frequency settling time. In an example embodiment, this is achieved using a combination of dynamic reprogramming of the radio synthesizer and referencing of the transmitted Base Station carrier for the Reference Oscillator. This allows the radio to operate within a small range of frequency error even though it passes into non-contiguous frequency plans. This embodiment will not add extraordinary complexity or cost to existing designs.

BRIEF DESCRIPTION OF THE DRAWINGS

Other advantages and objects of the present invention will be described in detail with reference to the accompanying drawings, in which.

DETAILED DESCRIPTION OF THE PRESENTLY PREFERRED EMBODIMENTS

Figure 1:
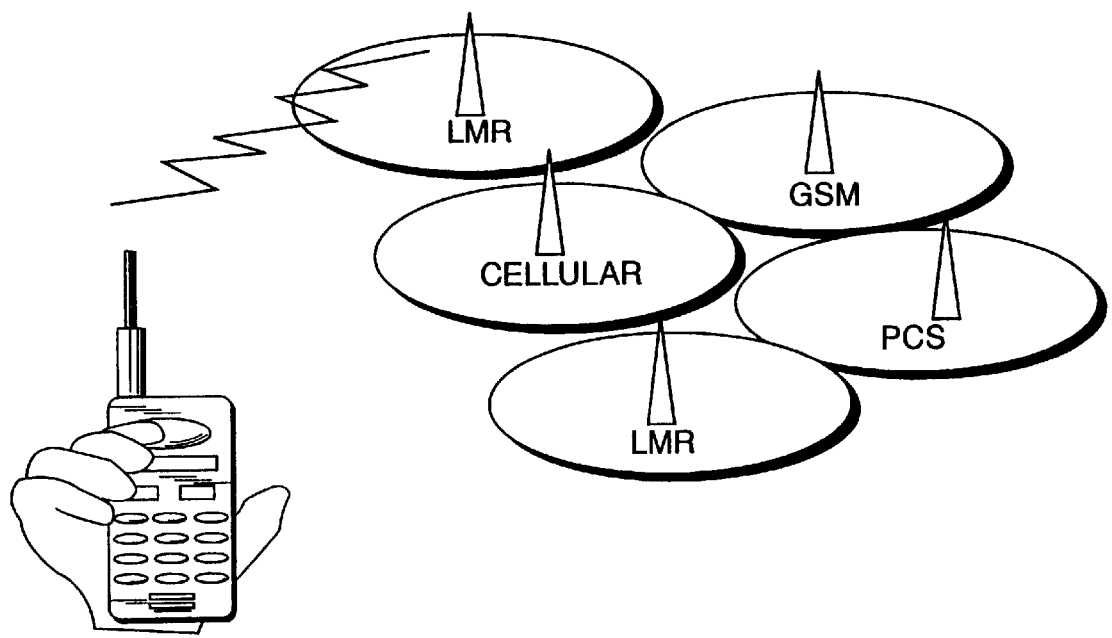
FIG. 1 is a schematic illustration of a mobile radio moving between different frequency plans.

Mobile radios have traditionally provided service to a unique group of users. Even within the realm of mobile telephones, the telephones were assigned to operate in either land-based cellular systems, land-based private systems, or satellite-based systems. Radios have rarely been compatible between different systems since compatibility would dictate that the radios be usable at different channel frequencies and in different channel frequency step sizes.

The present inventors have realized that these radios can be modified at low cost and with low manufacturing impact into radios that can be employed across frequency plans of different channel step sizes. This is particularly important since prior radios which attempted to provide multiple frequency plan access have not met these same cost and impact goals. In particular, radios that utilized multiple-loop synthesizers with one synthesizer per frequency plan were limited in that they were designed only for a limited number of frequency step sizes and could not accommodate communication systems that later employed different step sizes. Further, the multiple-loop synthesizers were complex and expensive. Other multiple frequency plan radios divided a reference oscillator frequency to a highest common denominator among whatever frequency step sizes were desired. But, this approach resulted in a lower reference oscillation frequency being injected into the phase detector. This creates low frequency spurious signals having a frequency lower than the loop bandwidth of the frequency synthesizer. They thus cannot be attenuated. This approach is unacceptable because it permits large spurious signals in the frequency pass band.

The present invention can be realized in a radio architecture that employs a single loop synthesizer that is dynamically reprogrammable. Once a frequency plan is identified that requires non-integer frequency step sizes, divider circuitry is reprogrammed to accommodate the new step sizes. This reprogramming occurs during channel frequency scanning. The reprogramming of the frequency divider circuitry provides course frequency adjustment of the radio local oscillator. In alternative embodiments, the radio can employ traditional integer-based divider circuitry or fractional-N-based divider circuitry.

In addition, the radio architecture employs an automatic frequency control circuit that recovers the carrier frequency of the received signal and provides closed-loop feedback control of the reference oscillator frequency within the telephone. As the reference oscillator frequency is adjusted, the local oscillator frequency, which is controlled by the reference oscillator, will be adjusted. The allowable frequency error control range of a typical crystal-controlled reference oscillator is small and thus, this frequency error control will provide fine frequency adjustment.

This approach allows radios to be used in multiple different frequency plans, with and without integer frequency channel step sizes.

Figure 2:
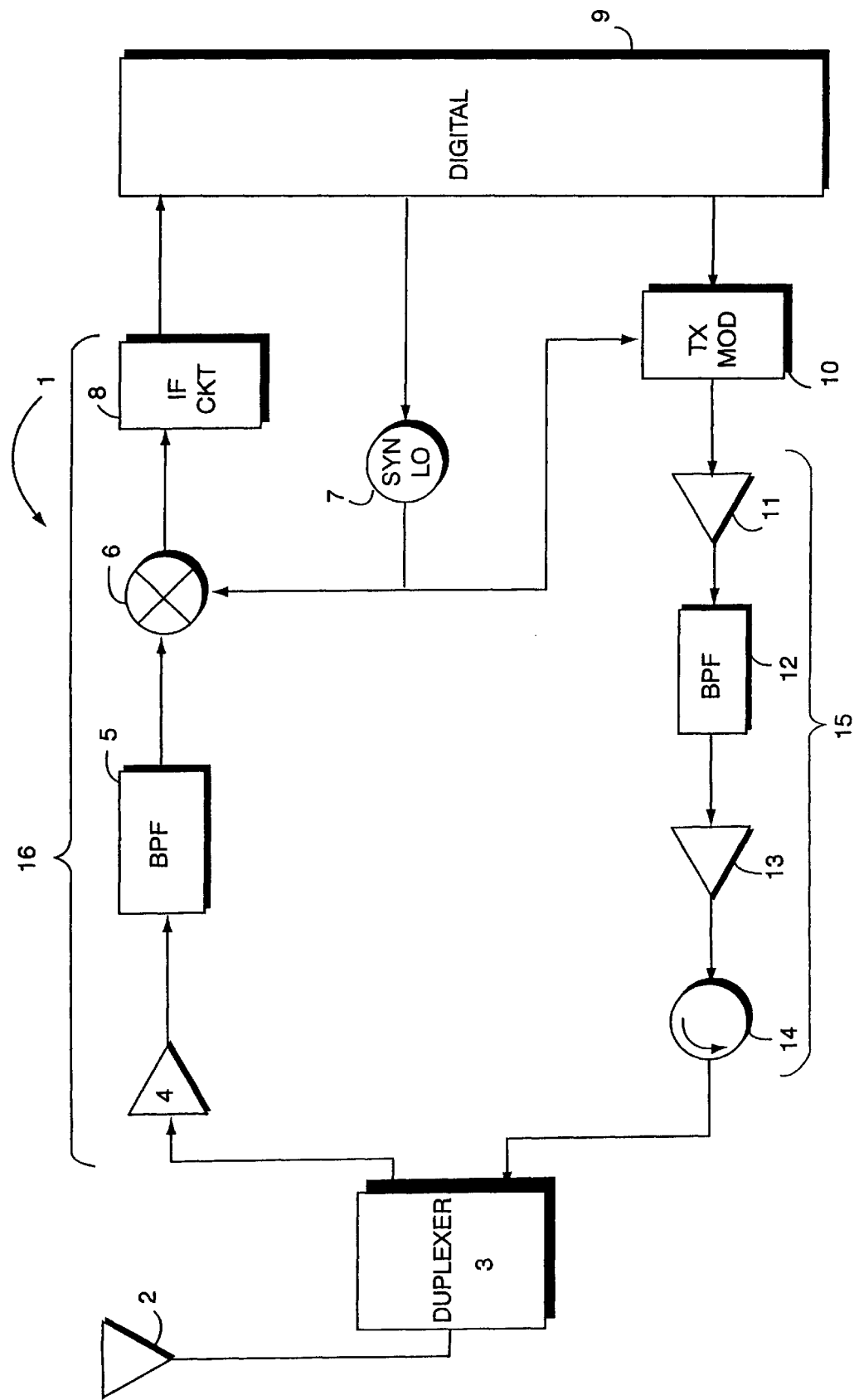
FIG. 2 is a schematic block diagram of an example embodiment of relevant mobile radio circuitry according to an example embodiment of the present invention.

FIG. 2 illustrates an example circuit diagram for a radio transmitter/receiver operating in accordance with the present invention. The radio circuit 1 includes an antenna 2 which transmits or receives wireless signals from/to the duplexer 3. The duplexer 3 selects either a transmit or receive mode, depending upon the particular operation of the radio at any given time. The receiver circuitry 16 includes an amplifier 4 connected to a band pass filter 5. The output of the band pass filter 5 is provided to mixer 6 which mixes the received signal with a demodulation pulse from synthesizer local oscillator 7. The mixed signal from the mixer 6 is provided to the intermediate frequency circuit 8 and then to digital processing circuitry 9. On the transmission end 15, the digital signal to be transmitted is provided by digital processing circuitry 9 to the transmission modulator 10. The transmission modulator 10 modulates the digital signal from the digital signal circuitry 9 with a modulation signal from the synthesizer local oscillator 7. The output of the transmission modulator 10 is provided to an amplifier 11 and then to band pass filter 12. The output of the band pass filter 12 is provided to amplifier 13 and then to circulator 14. Finally, this output is provided to the duplexer 3 which provides the transmission signal to the antenna 2 for transmission.

In operation, on the receiving end 16, the received signals are amplified by amplifier 4 and then filtered into a first band pass filter 5. Amplifier 4 and band pass filter 5 operate in traditional fashion as is well known to those of ordinary skill in the art. The output of the band pass filter 5 is mixed with the demodulation signal from the synthesizer local oscillator 7. The signal provided by the synthesizer local oscillator 7 is one which has been dynamically programmed in accordance with the descriptions provided herein and in particular with respect to FIG. 3. Lastly, the synthesizer local oscillator 7 will provide a demodulation signal to the mixer 6 in accordance with the channel frequency requirements of the frequency plan in which the radio circuit 1 is currently being employed.

The output of the mixer 6 is down-converted by IF circuit 8 in traditional fashion and then provided to digital processing circuitry 9.

On the transmission end 15, the signal to be transmitted is provided by digital processing circuitry 9 through the transmission modulator 10. The transmission modulator 10 receives its modulation signal from synthesized local oscillator 7 which again is dynamically programmed to the particular channel frequency required by the frequency plan being used by the radio circuit at the time of transmission. The output of the transmission modulator 10 is amplified in amplifier 11 and then passed through band pass filter 12, amplifier 13, and circulator 14 to duplexer 3 in traditional fashion.

Figure 3:
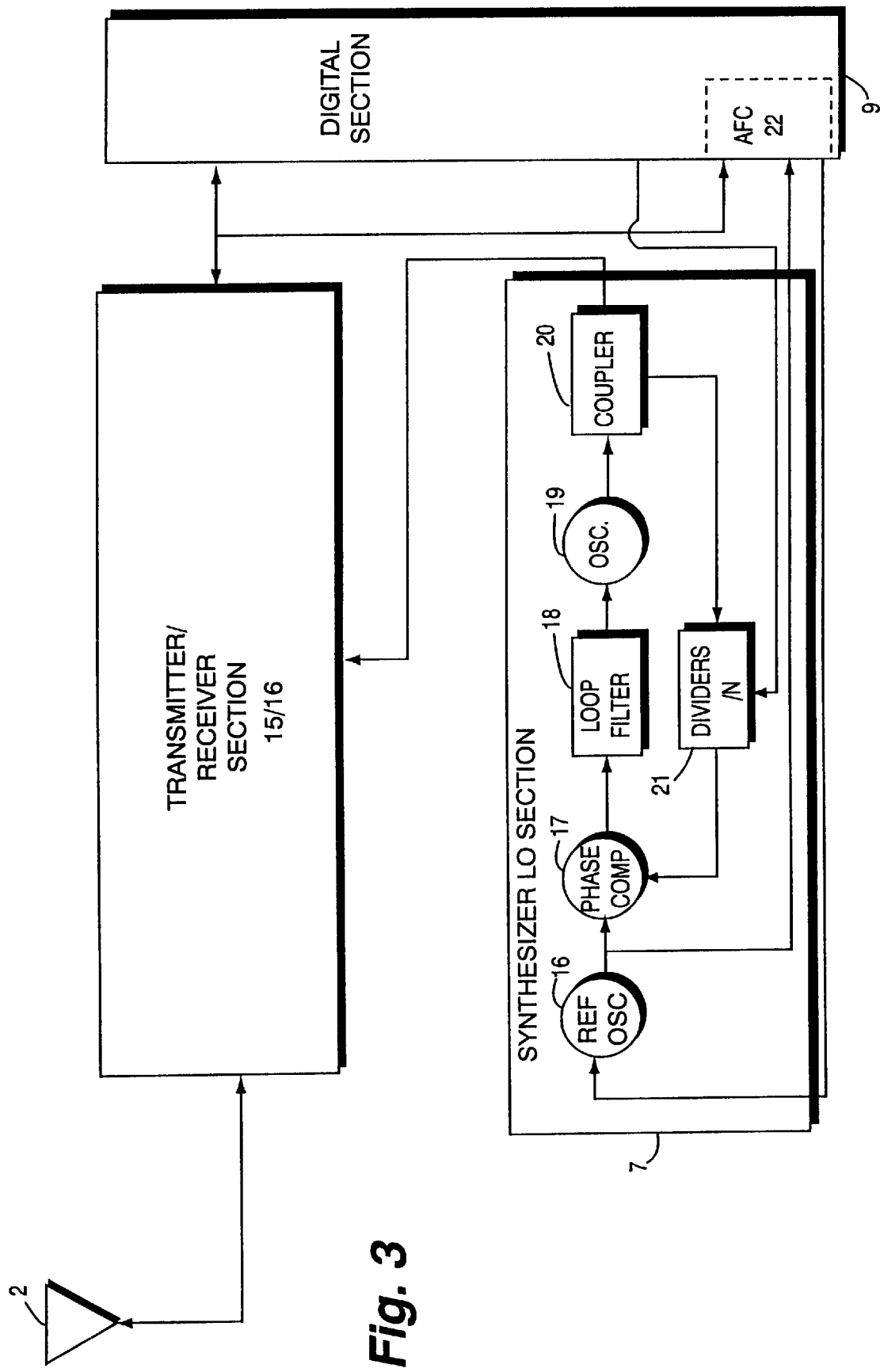
FIG. 3 is a schematic block diagram of the synthesizer local oscillator section of the circuit of FIG. 2.

FIG. 3 illustrates the synthesizer local oscillator section 7 of FIG. 2 in greater detail. Like FIG. 2, FIG. 3 shows antenna 2, transmitter and receiver sections 15 and 16 and digital processor circuitry 9. The transmitter/receiver sections 15/16 receive the modulation/demodulation oscillator signals from the synthesizer local oscillator 7, as shown in FIG. 2. In FIG. 3, the elements of the synthesizer local oscillator section 7 are illustrated in greater detail. The synthesizer local oscillator section 7 begins with a reference oscillator 16 which provides an oscillation signal output to phase comparator 17. Phase comparator 17 provides an output to loop filter 18, which is connected to oscillator 19. Oscillator 19 is connected to coupler 20. Coupler 20 splits the signal from oscillator 19 into an output signal destined for the transmitter/receiver sections 15/16 and an identical feedback signal to dividers 21. The dividers 21 feedback to the phase comparator 17.

In operation, the synthesizer local oscillator section 7 is connected to the digital processing circuitry 9 in order to provide a feedback signal to the reference oscillator 16. The reference oscillator 16 is variable and operated on the automatic frequency control of an automatic frequency control circuit 22 in the digital processing circuitry 9. The automatic frequency control circuitry 22 in the digital processing section 9 recovers the carrier frequency of the received signal from the receiver section 16 and employs this carrier frequency to maintain control of the reference oscillator 16. The carrier frequency, for example, in a cellular telephone system will be the transmitted base station carrier. This carrier frequency is used by the digital processing circuitry 9 to lock the reference oscillator 16 to within a small range of frequency error, thus providing fine tuning to the ultimate local oscillator signal provided by synthesizer local oscillator section 7 to the transmitter/receiver sections 15/16. With the reference oscillator 16 properly controlled, the proper reference frequency is provided to the phase comparator 17. The phase comparator 17 compares the output of the reference oscillator 16 to the feedback signal provided through the frequency divider circuitry 21. The output of the phase comparator 17 is a difference signal provided to loop filter 18. The oscillator 19 operates under the control of the output loop filter 18 such that the synthesizer local oscillator section 7 provides an appropriately precise modulation/de-modulation frequency for use by the transmitter/receiver sections 15/16 in accordance with the particular frequency plan being used by the radio circuit 1.

The dividers 21 in the feedback loop of the synthesizer local oscillator section 7 can be traditional integer based frequency divider circuitry or fractional-N based frequency divider circuitry. In either case, the dividers 21 are programmable to be employed in accordance with the frequency division required by the particular frequency plan channel step sizes used by the radio circuitry 1 at any given time. Thus, the dividers 21 will provide different feedback signals when the radio circuit 1 is employed in a mobile radio system employing, for example, a 25 KHz step size system versus a 30 KHz step size system. The dynamic reprogramming of the divider circuitry 21 provides large-scale frequency adjustment for the output of the synthesizer local oscillator section 7 since the feedback signal frequency from the divider circuitry 21 will significantly impact the ultimate signal frequency provided by oscillator 19.

The present approach is not limited to any particular frequency plan or type of mobile communication network. It will, for example, support both land-based and satellite-based systems. Also, the multiple frequency bands in the different plans supported by the present radios need not overlap or have any other type of relationship to each other. The bands may be contiguous or non-contiguous and may be placed sporadically within a frequency spectrum.

The present invention can be further enhanced by channel frequency search algorithms supplemented with channel frequency look-up tables. The channel search algorithm can be intelligently updated based on several parameters when roaming from one channel to another. The parameters can be constructed from several degrees of freedom and stored away in a database lookup table. These degrees of freedom can be, for example: if/then historical frequency channel loop equations, channel desirability weighting, probability weighting based on availability and total list of channels available across all desired frequency plans.

With the present invention, a single loop synthesizer is thus employed which is dynamically re-programmable and is used in combination with a received carrier recovery based automatic frequency control of the reference oscillator. Intelligent channel selection algorithms can also be collectively used to provide a low cost radio capable of providing service (with substantially non-degraded performance) across several telecommunication systems employing multiple frequency plans.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. A mobile radio for use within different frequency plans operating with different frequency channel step sizes, comprising:
    a single loop frequency synthesizer to provide different modulation signals in accordance with the different frequency channel step sizes through use of a single variable reference oscillator; and
    a received carrier recovery circuit to control the single variable reference oscillator.

2. A mobile radio according to claim 1, wherein the different frequency channel step sizes include a first frequency channel step size of a first frequency plan that is non-integer divisible by a second frequency channel step size of a second frequency plan.

3. A mobile radio according to claim 1, wherein the single loop frequency synthesizer is dynamically programmed in accordance with the different frequency channel step sizes.

4. A mobile radio according to claim 1, wherein the receiver carrier recovery circuit recovers a carrier frequency and locks the variable reference oscillator to substantially the recovered carrier frequency.

5. A mobile radio according to claim 1, wherein the mobile radio accommodates different frequency plans employing overlapping frequency bands.

6. A mobile radio according to claim 1, wherein the mobile radio accommodates different frequency plans employ non-overlapping frequency bands.

7. A mobile radio according to claim 1, wherein the mobile radio accommodates land-based and satellite-based frequency plans using the same single loop frequency synthesizer and the same received carrier recovery circuit.

8. A mobile radio according to claim 1, wherein the single loop frequency synthesizer further includes a fractional-N synthesizer.

9. A mobile radio according to claim 1, further including:
    a channel selector including a preprogrammed channel frequency lookup table having operation parameters for the different frequency plans.

10. A mobile radio according to claim 9, wherein the different parameters include one or more from the group consisting of:
    desirable frequency channels given,
    historical frequency channels found,
    channels weightings based on channel desirability,
    probabilities associated with specific channels, and
    total list of unique channels across all of the different frequency plans.

11. A mobile radio circuit to transmit and receive signals within multiple different frequency plans, comprising:
    a single loop synthesizer providing an oscillator signal corresponding to a current frequency plan out of the multiple different frequency plans;
    a transmitter/receiver section using the oscillator signal for modulation and demodulation of a desired signal; and
    a digital signal processor including a process to recover a carrier frequency from the transmitter/receiver section and provide that carrier frequency to the single loop synthesizer for use in setting the oscillator signal to the current frequency plan.

12. A mobile radio circuit according to claim 11, wherein the digital signal processor includes an automatic frequency control process and the single loop synthesizer further includes a reference oscillator having a variable output frequency controlled by the automatic frequency control.

13. A mobile radio circuit according to claim 11, wherein the single loop synthesizer includes a divider circuit feedback loop programmed by the digital signal processor in accordance with a frequency channel step size of a current frequency plan among the multiple different frequency plans.

14. A mobile radio according to claim 11, wherein the single loop synthesizer includes:
    a variable reference oscillator having an output reference frequency controlled by the digital signal processor in accordance with the recovered carrier frequency;

a phase comparator receiving the output of the variable reference oscillator at the output reference frequency;

a divider circuit feedback loop programmed by the digital signal processor in accordance with a frequency channel step size of a current frequency plan among the multiple different frequency plans and providing a divider circuit output to the phase comparator for comparison to the output of the variable reference oscillator; and a variable output oscillator providing a local oscillator output controlled by the phase comparison between the divider circuit output and the output of the variable reference oscillator.

15. A method of operating a radio telephone in multiple wireless communication plans imposing respectively different frequency channel step sizes, comprising the steps of:

dynamically re-programming a single loop synthesizer based on a frequency step size corresponding to a current wireless communication plan;

moving the radio telephone to another wireless communication plan; and dynamically reprogramming the single loop synthesizer based on a new frequency step size corresponding to said another wireless communication plan.

16. A method according to claim 15, further including the step, after all previously recited steps, of:

repeating all previously recited steps at least as often as the current frequency plan changes among the different frequency plans.

17. A method of transmitting and receiving wireless communications on different frequency plans using a common single loop synthesizer, comprising the steps of:

recovering a carrier frequency from a received wireless communication;

automatically frequency controlling a reference oscillator to provide a reference output at a reference frequency based on the recovered carrier frequency;

automatically programming a divider circuit to output a divider signal in accordance with a frequency channel step size corresponding to a current frequency plan among the different frequency plans;

phase comparing the reference output and the divider signal to provide a comparison signal; and setting a local oscillator signal to a frequency dependent upon the comparison signal.

* * * * *